(12) United States Patent
Lee et al.

(10) Patent No.: US 12,082,441 B2
(45) Date of Patent: Sep. 3, 2024

(54) DISPLAY APPARATUS HAVING A NARROW VIEWING ANGLE

(71) Applicant: LG Display Co., Ltd., Seoul (KR)

(72) Inventors: Keong Jin Lee, Seoul (KR); Hoon Kang, Goyang-si (KR); Byung Joo Lee, Seoul (KR); Dong Yeon Kim, Seoul (KR); Young Min Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 354 days.

(21) Appl. No.: 17/465,504

(22) Filed: Sep. 2, 2021

(65) Prior Publication Data

US 2022/0077431 A1 Mar. 10, 2022

(30) Foreign Application Priority Data

Sep. 10, 2020 (KR) ........................ 10-2020-0116035

(51) Int. Cl.
*H10K 50/86* (2023.01)
*G06F 3/041* (2006.01)
(Continued)

(52) U.S. Cl.
CPC ......... *H10K 50/865* (2023.02); *G06F 3/0412* (2013.01); *H10K 50/844* (2023.02);
(Continued)

(58) Field of Classification Search
CPC .. H10K 50/865; H10K 50/844; H10K 50/858; H10K 59/122; H10K 59/40;
(Continued)

(56) References Cited

U.S. PATENT DOCUMENTS

| 8,829,786 B2 | 9/2014 | Sumida et al. |
| 9,911,945 B2 | 3/2018 | Matsumoto |

(Continued)

FOREIGN PATENT DOCUMENTS

| JP | 2013-016272 A | 1/2013 |
| JP | 2017-157290 A | 9/2017 |

(Continued)

OTHER PUBLICATIONS

Korean Intellectual Property Office, Office Action, Korean Patent Application No. 10-2020-0116035, Jul. 3, 2024, 11 pages.

*Primary Examiner* — Kyoung Lee
(74) *Attorney, Agent, or Firm* — Fenwick & West LLP (57) ABSTRACT

A display apparatus having a narrow viewing angle is provided. The display apparatus may include a device substrate including a first pixel area; a bank insulating layer on the device substrate, the bank insulating layer defining a first emission region in the first pixel area; a light-emitting device including a lower electrode, a light-emitting layer and an upper electrode, which are sequentially stacked on the first emission region; a light-blocking pattern on the bank insulating layer, the light-blocking pattern including a first opening disposed on the light-emitting device; and a first pixel lens on the first opening of the light-blocking pattern, the first pixel lens having a horizontal width larger than the first emission region, wherein a horizontal width of the first opening is proportional to a vertical distance between the light-emitting layer and the light-blocking pattern. Thus, the central luminance of the pixel area may be improved.

20 Claims, 5 Drawing Sheets

(51) Int. Cl.
*H10K 50/844* (2023.01)
*H10K 50/858* (2023.01)
*H10K 59/122* (2023.01)
*H10K 59/40* (2023.01)
*G06F 3/044* (2006.01)

(52) U.S. Cl.
CPC ......... *H10K 50/858* (2023.02); *H10K 59/122* (2023.02); *H10K 59/40* (2023.02); *G06F 3/0446* (2019.05); *G06F 2203/04111* (2013.01)

(58) Field of Classification Search
CPC ..... H10K 2102/3026; H10K 2102/351; H10K 59/126; H10K 59/12; H10K 50/8426; G06F 3/0412; G06F 3/0446; G06F 2203/04111
See application file for complete search history.

(56) References Cited

U.S. PATENT DOCUMENTS

| | | | |
|---|---|---|---|
| 10,243,031 B2 | 3/2019 | Lee et al. | |
| 2013/0002130 A1* | 1/2013 | Sumida | H10K 50/852 |
| | | | 313/504 |
| 2017/0250375 A1* | 8/2017 | Matsumoto | H10K 50/854 |
| 2018/0069070 A1 | 3/2018 | Lee et al. | |

FOREIGN PATENT DOCUMENTS

| | | |
|---|---|---|
| KR | 10-2018-0027706 A | 3/2018 |
| KR | 10-2020-0080611 A | 7/2020 |

* cited by examiner

DISPLAY APPARATUS HAVING A NARROW VIEWING ANGLE

CROSS-REFERENCE TO RELATED APPLICATION

This application claims the benefit of Republic of Korea Patent Application No. 10-2020-0116035 filed on Sep. 10, 2020, which is hereby incorporated by reference in its entirety.

BACKGROUND

Field of Technology

The present disclosure relates to a display apparatus having a narrow viewing angle by restricting a travelling direction of light emitted from each pixel area.

Discussion of the Related Art

Generally, an electronic appliance, such as a monitor, a TV, a laptop computer and a digital camera, includes a display apparatus to realize an image. The display apparatus may include a plurality of pixel area. Each of the pixel areas may emit light displaying a specific color. For example, a light-emitting device may be disposed in each pixel area. The light-emitting device may include a light-emitting layer disposed between two electrodes.

The display apparatus may reduce a viewing angle so that the image provided to user is not recognized by other people around. For example, in the display apparatus, a light control film (LCF) may be attached to a display panel realizing the image, so that a travelling direction of light emitted from each pixel area of the display panel may be restricted. However, in the display apparatus, the overall thickness is increased and the central luminance of each pixel area may be decreased due to the light control film.

SUMMARY

Accordingly, the present disclosure is directed to a display apparatus that substantially obviates one or more problems due to limitations and disadvantages of the related art.

An object of the present disclosure is to provide a display apparatus capable of reducing the viewing angle without affecting the central luminance of each pixel area.

Another object of the present disclosure is to provide a display apparatus to restrict a travelling direction of the light emitted from each pixel area with minimizing the increasing of the overall thickness.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the invention, as embodied and broadly described herein, there is provided a display apparatus comprising a device substrate. The device substrate includes a first pixel area. A bank insulating layer is disposed on the device substrate. The bank insulating layer defines a first emission region in the first pixel area. A light-emitting device is disposed on the first emission region of the device substrate. The light-emitting device includes a lower electrode, a light-emitting layer and an upper electrode, which are sequentially stacked. A light-blocking pattern is disposed on the bank insulating layer. The light-blocking pattern includes a first opening on the light-emitting device. A first pixel lens is disposed on the first opening of the light-blocking pattern. The first pixel lens has a horizontal width larger than the first emission region. The horizontal width of the first opening is proportional to a vertical distance between the light-emitting layer and the light-blocking pattern.

A location of the light-blocking pattern and the horizontal width of the first opening between the light-emitting device and the first pixel lens may satisfy the below equation. Herein, $g_1$ is a vertical distance between the light-emitting layer and the light-blocking pattern, $g_2$ is a vertical distance between a lower surface of the light-blocking pattern and the first pixel lens, $P_w$ is a horizontal width of the first pixel area, $A_w$ is a horizontal width of the first opening, and $B_w$ is a half of a horizontal width of the bank insulating layer in the first pixel area.

$$\frac{g_1}{g_2} = \frac{2B_w}{P_w - A_w} - 1 \qquad \text{[Equation]}$$

The first pixel lens may have the horizontal width same as the first pixel area.

The bank insulating layer and the light-emitting device in the first pixel area may have the symmetrical shape with respect to the center of the first pixel area.

The horizontal width of the first opening may be at least 55% of the horizontal width of the first pixel area.

The horizontal width of the first emission region may be at least 40% of the horizontal width of the first pixel area.

A second pixel lens may be disposed on a second pixel area of the device substrate which is disposed adjacent to the first pixel area. The bank insulating layer may define a second emission region in the second pixel area. The light-blocking pattern may include a second opening between the second emission region and the second pixel lens. The lower electrode, the light-emitting layer and the upper electrode of the light-emitting device may extend between the second emission region of the device substrate and the second opening. The bank insulating layer between the first emission region and the second emission region may be disposed between the lower electrode and the light-emitting layer.

A horizontal width of the second opening may be the same as the horizontal width of the first opening.

The light-blocking pattern may include a metal.

The bank insulating layer and the light-emitting device may be covered by an encapsulating structure. A touch structure may be disposed between the encapsulating structure and the first pixel lens. The light-blocking pattern may include the same material as a touch electrode of the touch structure.

In another embodiment, there is provided a display apparatus comprising a lower electrode and a bank insulating layer which are disposed on a device substrate. The bank insulating layer covers an end and the other end of the lower electrode. A light-emitting layer is disposed on a portion of the lower electrode exposed by the bank insulating layer. An upper electrode is disposed on the light-emitting layer. A pixel lens is disposed on the bank insulating layer and the upper electrode. A light-blocking pattern is disposed between the bank insulating layer and the pixel lens. The light-blocking pattern includes an opening disposed between the upper electrode and the pixel lens. A horizontal width of the opening is inversely proportion to a vertical distance between the light-blocking pattern and the pixel lens.

A color filter may be disposed between the upper electrode and the pixel lens. The color filter may fill the opening of the light-blocking pattern.

A touch electrode may be disposed between the bank insulating layer and the light-blocking pattern. The touch electrode may be spaced away from the opening of the light-blocking pattern.

The light-blocking pattern may include an insulating material.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENT

Figure 1:
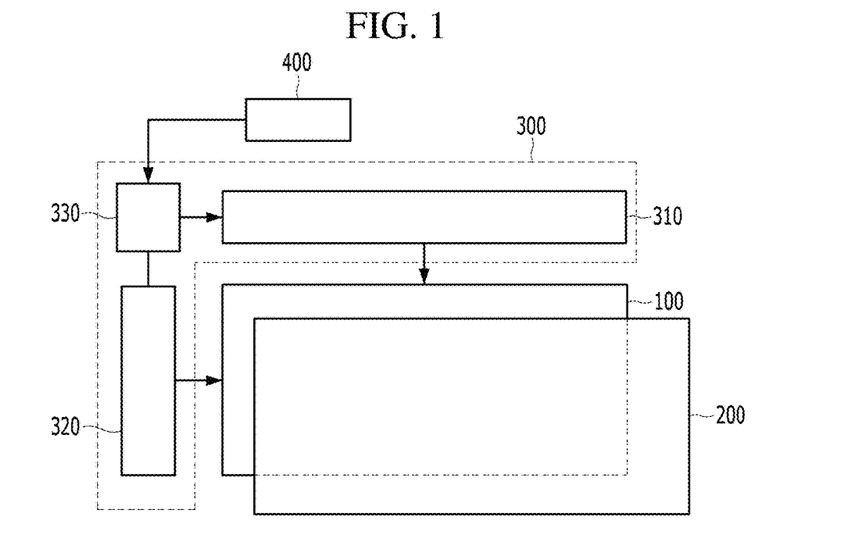
FIG. 1 is a view schematically showing a display apparatus according to an embodiment of the present disclosure.
Figure 2:
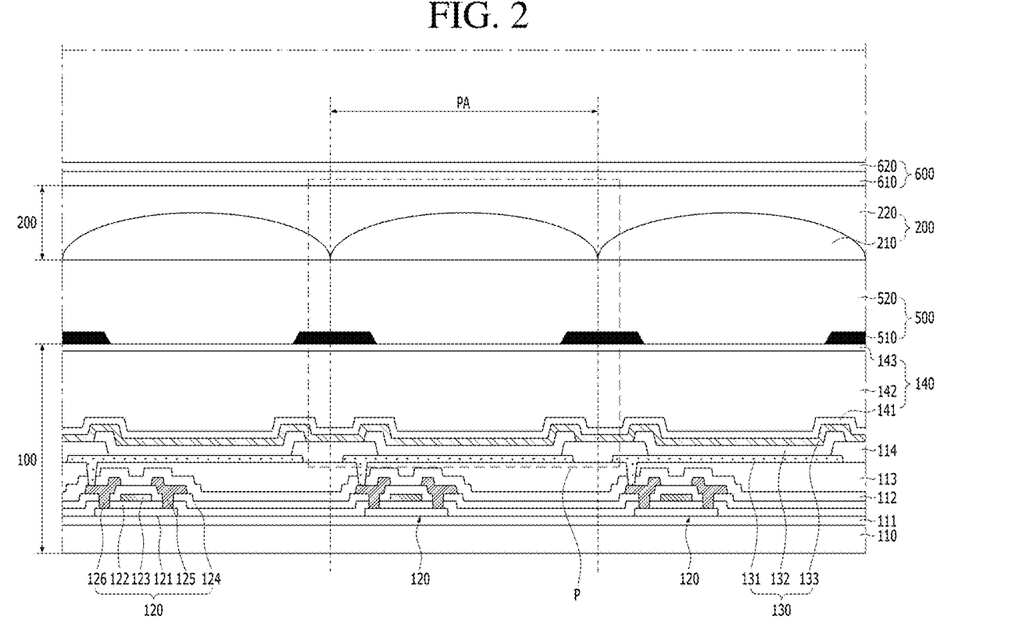
FIG. 2 is a view partially showing a cross-section of the display apparatus according to the embodiment of the present disclosure.
Figure 3:
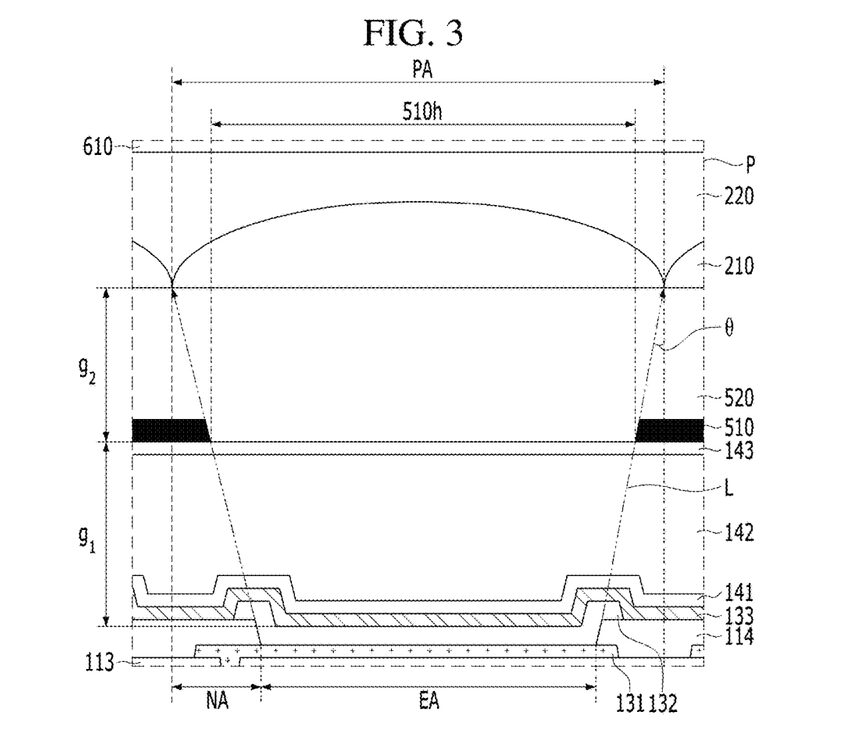
FIG. 3 is an enlarged view of P region in FIG. 2 according to the embodiment of the present disclosure.

FIG. 1 is a view schematically showing a display apparatus according to an embodiment of the present disclosure. FIG. 2 is a view partially showing a cross-section of the display apparatus according to the embodiment of the present disclosure. FIG. 3 is an enlarged view of P region in FIG. 2 according to the embodiment of the present disclosure.

Referring to FIGS. 1 to 3, the display apparatus according to the embodiment of the present disclosure may include a display panel 100 and a lens assembly 200. The display panel 100 may realize an image provided to user. For example, the display panel 100 may be controlled by a display driver 300. The display driver 300 may supply various signals necessary for realizing the image to the display panel 100. For example, the display driver 300 may include a data driver 310, a scan driver 320, and a timing controller 330.

The data driver 310 may apply data signals to the display panel 100. The scan driver 320 may apply scan signals to the display panel 100. The timing controller 330 may control the data driver 310 and the scan driver 320. For example, the data driver 310 may receive digital video data and source timing control signal from the timing controller 330, and the scan driver 320 may receive clock signals, reset clock signals and start signals from the timing controller 330. The timing controller 330 may be electrically connected to a viewing location detecting part 400. The viewing location detecting part 400 may detect the location of the user. For example, the timing controller 330 may change a signal applying to the data driver 310 and the scan driver 320 according to the location of the user.

The display panel 100 may include a device substrate 110. The device substrate 110 may include an insulating material. For example, the device substrate 110 may include glass or plastic. The device substrate 110 may include a plurality of pixel area PA. Each of the pixel areas PA may include an emission region EA and a non-emission region NA. Light displaying a specific color may be emitted from the emission region EA of each pixel area PA. For example, a light-emitting device 130 may be disposed on the emission region EA of each pixel area PA. The light-emitting device 130 of each pixel area PA may include a lower electrode 131, a light-emitting layer 132 and an upper electrode 133, which are sequentially stacked on the corresponding emission region EA of the device substrate 110.

The lower electrode 131 may include a conductive material. The lower electrode 131 may include a material having high reflectance. For example, the lower electrode 131 may include a metal, such as aluminum Al and silver Ag. The lower electrode 131 may have a multi-layer structure. For example, the lower electrode 131 may have a structure in which the reflective conductive layer formed of a metal is disposed between transparent conductive layers formed of a transparent conductive material, such as ITO and IZO.

The light-emitting layer 132 may generate light having luminance corresponding to a voltage difference between the lower electrode 131 and the upper electrode 133. For example, the light-emitting layer 132 may include an emission material layer (EML) having an emission material. The emission material may include an organic material, an inorganic material or a hybrid material. For example, the display panel 100 of the display apparatus according to the embodiment of the present disclosure may be an organic light-emitting display device including the light-emitting layer 132 formed of an organic material.

The upper electrode 133 may include a conductive material. The upper electrode 133 may include a material different from the lower electrode 131. For example, the upper electrode 133 may be a transparent electrode formed of a transparent conductive material, such as ITO and IZO. Thus, in the display panel 100 of the display apparatus according to the embodiment of the present disclosure, the light generated from the light-emitting layer 132 may be emitted to outside through the upper electrode 133.

A driving circuit for controlling the light-emitting device 130 may be disposed in each pixel area PA. The driving circuit may generate a driving current corresponding to the data signal according to the scan signal. For example, the driving circuit may include at least one thin film transistor 120. The thin film transistor 120 may include a semiconductor pattern 121, a gate insulating layer 122, a gate electrode 123, an interlayer insulating layer 124, a source electrode 125 and a drain electrode 126.

The semiconductor pattern 121 may include a semiconductor material. For example, the semiconductor pattern 121 may include amorphous silicon or polycrystalline silicon. The semiconductor pattern 121 may be an oxide semiconductor. For example, the semiconductor pattern 121 may include IGZO. The semiconductor pattern 121 may include a source region, a drain region and a channel region. The channel region may be disposed between the source region and the drain region. The source region and the drain region may have a resistance lower than the channel region.

The gate insulating layer 122 may be disposed on the semiconductor pattern 121. The gate insulating layer 122 may extend beyond the semiconductor pattern 121. For example, a side of the semiconductor pattern 121 may be covered by the gate insulating layer 122. The gate insulating layer 122 of each pixel area PA may be in contact with the gate insulating layer 122 of adjacent pixel area PA. The gate insulating layer 122 may include an insulating material. For example, the gate insulating layer 122 may include an inorganic insulating material, such as silicon oxide and/or silicon nitride.

The gate electrode 123 may be disposed on the gate insulating layer 122. For example, the gate electrode 123 may be insulated from the semiconductor pattern 121 by the gate insulating layer 122. The gate electrode 123 may overlap the channel region of the semiconductor pattern 121. For example, the channel region of the semiconductor pattern 121 may have an electrically conductivity corresponding to a voltage applied to the gate electrode 123. The gate electrode 123 may include a conductive material. For example, the gate electrode 123 may include a metal, such as aluminum (Al), chrome (Cr), molybdenum (Mo), Titanium (Ti), copper (Cu), and tungsten (W).

The interlayer insulating layer 124 may be disposed on the gate electrode 123. The interlayer insulating layer 124 may extend beyond the gate electrode 123 and the semiconductor pattern 121. For example, a side of the gate electrode 123 may be covered by the interlayer insulating layer 124. The interlayer insulating layer 124 of each pixel area PA may be in contact with the interlayer insulating layer 124 of adjacent pixel area PA. The interlayer insulating layer 124 may include an insulating material. For example, the interlayer insulating layer 124 may include an inorganic insulating material, such as silicon oxide.

The source electrode 125 may be disposed on the interlayer insulating layer 124. For example, the source electrode 125 may be insulated from the gate electrode 123 by the interlayer insulating layer 124. The source electrode 125 may be electrically connected to the source region of the semiconductor pattern 121. For example, the gate insulating layer 122 and the interlayer insulating layer 124 may include a source contact hole partially exposing the source region of the semiconductor pattern 121. The source electrode 125 may be in direct contact with the source region of the semiconductor pattern 121 within the source contact hole. For example, the source electrode 125 may include a portion overlapping with the source region of the semiconductor pattern 121. The source electrode 125 may include a conductive material. For example, the source electrode 125 may include a metal, such as aluminum (Al), chrome (Cr), molybdenum (Mo), Titanium (Ti), copper (Cu), and tungsten (W). The source electrode 125 may include a material different from the gate electrode 123.

The drain electrode 126 may be disposed on the interlayer insulating layer 124. For example, the drain electrode 126 may be insulated from the gate electrode 123 by the interlayer insulating layer 124. The drain electrode 126 may be electrically connected to the drain region of the semiconductor pattern 121. The drain electrode 126 may be spaced away from the source electrode 125. For example, the gate insulating layer 122 and the interlayer insulating layer 124 may include a drain contact hole partially exposing the drain region of the semiconductor pattern 121. The drain electrode 126 may be in direct contact with the drain region of the semiconductor pattern 121 within the drain contact hole. For example, the drain electrode 126 may include a portion overlapping with the drain region of the semiconductor pattern 121. The drain electrode 126 may include a conductive material. For example, the drain electrode 126 may include a metal, such as aluminum (Al), chrome (Cr), molybdenum (Mo), Titanium (Ti), copper (Cu), and tungsten (W). The drain electrode 126 may include the same material as the source electrode 125. For example, the drain electrode 126 may include a material different from the gate electrode 123.

The driving circuit of each pixel area PA may be disposed between the device substrate 110 and the light-emitting device 130 of the corresponding pixel area PA. For example, the semiconductor pattern 121 of each driving circuit may be disposed close to the device substrate 110. A buffer layer 111 may be disposed between the device substrate 110 and the driving circuit of each pixel area PA. The buffer layer 111 may prevent or at least reduce pollution due to the device substrate 110 during a process of forming the driving circuit of each pixel area PA. For example, an upper surface of the device substrate 110 toward the light-emitting device 130 of each pixel area PA may be completely covered by the buffer layer 111. The buffer layer 111 may include an insulating material. For example, the buffer layer 111 may include an inorganic material, such as silicon oxide and/or silicon nitride. The buffer layer 111 may have a multi-layer structure.

A lower passivation layer 112 may be disposed between the driving circuit and the light-emitting device 130 of each pixel area PA. The lower passivation layer 112 may prevent or at least reduce the damage of the driving circuits due to external impact and moisture. For example, the driving circuit of each pixel area PA may be completely covered by the lower passivation layer 112. The lower passivation layer 112 may extend beyond each driving circuit. For example, the lower passivation layer 112 on each pixel area PA may be in contact with the lower passivation layer 112 on adjacent pixel area PA. The lower passivation layer 112 may include an insulating material. For example, the lower passivation layer 112 may include an inorganic insulating material, such as silicon oxide.

An over-coat layer 113 may be disposed between the lower passivation layer 112 and the light-emitting device 130 of each pixel area PA. The over-coat layer 113 may remove a thickness difference due to the driving circuit of each pixel area PA. For example, an upper surface of the over-coat layer 113 toward the light-emitting device 130 of each pixel area PA may be a flat surface. The over-coat layer on each pixel area PA may be in contact with the over-coat layer on adjacent pixel area PA. The over-coat layer 113 may include an insulating material. The over-coat layer 113 may include a material different from the lower passivation layer 112. For example, the over-coat layer 113 may include an organic insulating material.

The light-emitting device 130 of each pixel area PA may be electrically connected to the driving circuit of the corresponding pixel area PA. For example, the over-coat layer 113 may include electrode contact holes partially exposing the drain electrode 126 of each pixel area PA. The lower electrode 131 of each pixel area PA may be in direct contact with the drain electrode 126 of the corresponding pixel area PA by one of the electrode contact holes. For example, the lower electrode 131 of each pixel area PA may include a portion overlapping with the drain electrode 126 of the corresponding pixel area PA.

The light-emitting device 130 of each pixel area PA may be controlled, independently. For example, the lower electrode 131 of each pixel area PA may be insulated from the lower electrode 131 of adjacent pixel area PA. The lower electrode 131 of each pixel area PA may be spaced away from the lower electrode 131 of adjacent pixel area PA. A bank insulating layer 114 may be disposed on the over-coat layer 113. For example, a space between adjacent lower electrodes 131 may be filled by the bank insulating layer 114. The bank insulating layer 114 may include an insulating material. For example, the bank insulating layer 114 may include an organic insulating material. The bank insulating layer 114 may include a material different from the over-coat layer 113.

The bank insulating layer 114 may cover an end and the other end of the lower electrode 131 in each pixel area PA. The light-emitting layer 132 and the upper electrode 133 of each pixel area PA may be sequentially stacked on a portion of the corresponding lower electrode 131 exposed by the bank insulating layer 114. For example, the bank insulating layer 114 may define the emission region EA in each pixel area PA. The non-emission region NA of each pixel area PA may overlap the bank insulating layer 114. The emission region EA may be disposed between two non-emission regions NA in each pixel area PA. The bank insulating layer 114 and the light-emitting device 130 in each pixel area PA may have a symmetrical shape with respect to the center of the corresponding pixel area PA. For example, a horizontal width of the bank insulating layer 114 covering an end of the lower electrode 131 in each pixel area PA may be the same as a horizontal width of the bank insulating layer 114 covering the other end of the lower electrode 131 in the corresponding pixel area PA.

Light emitted from the emission region EA of each pixel area PA may display a color different from light emitted from the emission region EA of adjacent pixel area PA. For example, the light-emitting layer 132 of each pixel area PA may include a material different from the light-emitting layer 132 of adjacent pixel area PA. The light-emitting layer 132 of each pixel area PA may be spaced away from the light-emitting layer 132 of adjacent pixel area PA. For example, both ends of each light-emitting layer 132 may be disposed on the bank insulating layer 114 in the corresponding pixel area PA.

A voltage applied to the upper electrode 133 of each pixel area PA may be the same as a voltage applied to the upper electrode 133 of adjacent pixel area PA. For example, the upper electrode 133 of each pixel area PA may be electrically connected to the upper electrode 133 of adjacent pixel area PA. The upper electrode 133 of each pixel area PA may include the same material as the upper electrode 133 of adjacent pixel area PA. For example, the upper electrode 133 of each pixel area PA may be in direct contact with the upper electrode 133 of adjacent pixel area PA.

An encapsulating structure 140 may be disposed on the bank insulating layer 114 and the light-emitting device 130 of each pixel area PA. The encapsulating structure 140 may prevent or at least reduce the damage of the light-emitting devices 130 due to the external impact and moisture. For example, a surface of each light-emitting device 130 opposite to the device substrate 110 may be completely covered by the encapsulating structure 140. The encapsulating structure 140 may extend along the upper surface of the device substrate 110. For example, the encapsulating structure 140 on each pixel area PA may be in contact with the encapsulating structure 140 on adjacent pixel area PA. The encapsulating structure 140 may have a multi-layer structure. For example, the encapsulating structure 140 may include a first encapsulating layer 141, a second encapsulating layer 142 and a third encapsulating layer 143, which are sequentially stacked on the upper electrode 133 of each light-emitting device 130. The first encapsulating layer 141, the second encapsulating layer 142 and the third encapsulating layer 143 may include an insulating material. The second encapsulating layer 142 may include a material different from the first encapsulating layer 141 and the third encapsulating layer 143. For example, the first encapsulating layer 141 and the third encapsulating layer 143 may include an inorganic insulating material, and the second encapsulating layer 142 may include an organic insulating material. Thus, in the display panel 100 of the display apparatus according to the embodiment of the present disclosure, the damage of the light-emitting devices 130 due to the external impact and moisture may be effectively prevented or at least reduced. A thickness difference due to the light-emitting device 130 of each pixel area PA may be removed by the second encapsulating layer 142. For example, an upper surface of the encapsulating structure 140 opposite to the device substrate 110 may be a flat surface.

The lens assembly 200 may be disposed on the display panel 100. The lens assembly 200 may be disposed on a path of the light emitted from the display panel 100. For example, the lens assembly 200 may be disposed on the encapsulating structure 140. The lens assembly 200 may include a plurality of pixel lens 210. A lower surface of each pixel lens 210 toward the display panel 100 may be a flat surface. A surface of each pixel lens 210 opposite to the display panel 100 may have semi-circular shape. The pixel lenses 210 may be disposed side by side. For example, the lens assembly 200 may include a lenticular lens. Each pixel area PA of the display panel 100 may overlap one of the pixel lenses 210. Thus, in the display apparatus according to the embodiment of the present disclosure, the light emitted from each pixel area PA may be provided to the user through one of the pixel lenses 210. Therefore, in the display apparatus according to the embodiment of the present disclosure, the central luminance of each pixel area PA may be increased.

The lens assembly 200 may include a lens cover layer 220 covering the pixel lenses 210. The lens cover layer 220 may prevent or at least reduce the damage of the pixel lenses 210 due to the external impact and moisture. For example, the surface of each pixel lens 210 having the semi-circular shape may be completely covered by the lens cover layer 220. The lens cover layer 220 may remove a thickness difference due to the pixel lenses 210. For example, a surface of the lens cover layer 220 opposite to the display panel 100 may be a flat surface. The lens cover layer 220 may include an insulating material. The lens cover layer 220 may have a refractive index different from the pixel lenses 210. For example, the refractive index of the lens cover layer 220 may be smaller than the refractive index of each pixel lens 210. Thus, in the display apparatus according to the embodiment of the present disclosure, the light emitted from each pixel area PA of the display panel 100 may be effectively condensed by the lens assembly 200.

A viewing angle control element 500 may be disposed between the display panel 100 and the lens assembly 200. The viewing angle control element 500 may restrict a travelling direction of the light emitted from each pixel area PA of the display panel 100. For example, the viewing angle control element 500 may include a light-blocking pattern 510 between the bank insulating layer 114 of the display panel 100 and the lens assembly 200. The light-blocking pattern 510 may include a material capable of blocking light. For example, the light-blocking pattern 510 may include a material capable of absorbing the light, such as black dye. The light-blocking pattern 510 may include openings 510h between each light-emitting device 130 of the display panel 100 and the lens assembly 200. Thus, in the display apparatus according to the embodiment of the present disclosure, the light emitted from each pixel area PA of the display panel 100 may be incident on the pixel lens 210 overlapping with the corresponding pixel area PA through one of the openings 510h of the light-blocking pattern 510. That is, in the display apparatus according to the embodiment of the present disclosure, a viewing angle may be restricted by the light-blocking pattern 510. Therefore, in the display apparatus according to the embodiment of the present disclosure, the image provided to the user may be not recognized by other people around. In one embodiment, the light-blocking pattern 510 may include another opening 510h between an adjacent emission region defined by the bank insulating layer 114 in the adjacent second pixel area and the adjacent pixel lens, wherein the lower electrode 131, the light-emitting layer 132 and the upper electrode 133 of the light-emitting device 130 on one emission region may extend between the adjacent emission region of the device substrate 110 and the another opening 510h, and the bank insulating layer 114 between the adjacent emission regions may be disposed between the lower electrode 131 and the light-emitting layer 132.

The viewing angle control element 500 may include a pattern cover layer 520 on the light-blocking pattern 510. The pattern cover layer 520 may prevent or at least reduce the damage of the light-blocking pattern 510 due to the external impact. The light-blocking pattern 510 may be completely covered by the pattern cover layer 520. The pattern cover layer 520 may remove a thickness difference due to the light-blocking pattern 510. For example, the opening 510h in each pixel area PA may be filled by the pattern cover layer 520. An upper surface of the pattern cover layer 520 toward the lens assembly 200 may be a flat surface. The pattern cover layer 520 may include an insulating material. For example, the pattern cover layer 520 may include silicon oxide. The pattern cover layer 520 may include a material having high transmittance. Thus, in the display apparatus according to the embodiment of the present disclosure, decreasing the luminance of each pixel area PA due to the viewing angle control element 500 may be reduced.

A space between the display panel 100 and the lens assembly 200 may be completely filed by the viewing angle control element 500. For example, the light-blocking pattern 510 and the pattern cover layer 520 may be in direct contact with the encapsulating structure 140 of the display panel 100, and the pixel lenses 210 of the lens assembly 200 may be in direct contact with the pattern cover layer 520 of the viewing angle control element 500. That is, in the display apparatus according to the embodiment of the present disclosure, an air-gap may be not formed between the display panel 100 and the lens assembly 200. The pattern cover layer 520 may have the refractive index between the encapsulating structure 140 and the pixel lenses 210. For example, the pattern cover layer 520 may have the refractive index same as the third encapsulating layer 143. Thus, in the display apparatus according to the embodiment of the present disclosure, loss of the light due to the rapidly change of the refractive index between the display panel 100 and the lens assembly 200 may be reduced.

The viewing angle control element 500 may be formed by using a process of forming the driving circuit and the light-emitting devices 130 of the display panel 100. For example, a method for forming the viewing angle control element 500 may include a step of forming a light-blocking layer by depositing a light-blocking material on the encapsulating structure 140, a step of forming the light-blocking pattern 510 by patterning the light-blocking layer by etching process using a mask pattern, and a step of forming the pattern cover layer 520 by depositing an insulating material on the light-blocking pattern 510. Thus, in the display apparatus according to the embodiment of the present disclosure, a defect caused by an alignment error between each pixel area PA of the display panel 100 and the light-blocking pattern 510 may be minimized. That is, in the display apparatus according to the embodiment of the present disclosure, a luminance deviation of the pixel areas PA may be prevented. Therefore, in the display apparatus according to the embodiment of the present disclosure, the process efficiency may be improved.

The light passing through each opening 510h of the light-blocking pattern 510 may be provided to the user through the pixel lens 210 on the corresponding pixel area PA of the display panel 100. Each of the pixel lenses 210 may have a horizontal width same as the corresponding pixel area PA of the display panel 100. Thus, in the display apparatus according to the embodiment of the present disclosure, the amount of the light provided to the user through each pixel lens 210 may be maximized. That is, in the display apparatus according to the embodiment of the present disclosure, the light amount of each pixel area PA may be maximized. Therefore, in the display apparatus according to the embodiment of the present disclosure, the central luminance of each pixel area PA may be increased.

The light traveling from each pixel area PA of the display panel 100 to the pixel lens 210 on adjacent pixel area PA may be blocked by the light-blocking pattern 510. For example, an inclination angle θ of the light L travelling from an end of each emission region EA to an end of the corresponding pixel lens 210 may satisfy the below equation 1. Herein, $g_1$ is a vertical distance between the light-emitting layer 132 and the light-blocking pattern 510, $g_2$ is a vertical distance between a lower surface of the light-blocking pattern 510 and the pixel lens 210 and $B_w$ is a half of a horizontal width of the bank insulating layer 114 in each pixel area PA.

$$\tan\theta = \frac{B_w}{(g_1 + g_2)} \quad \text{[Equation 1]}$$

Since a horizontal width of each pixel area PA is the sum of a horizontal width of the light-blocking pattern 510 and a horizontal width of the opening 510h in the corresponding pixel area PA, the below equations 2 and 3 may be derived. Herein, $P_w$ is a horizontal width of the pixel area PA, and $A_w$ is a horizontal width of the opening 510h.

$$2g_2\tan\theta + A_w = P_w \quad \text{[Equation 2]}$$

$$\tan\theta = \frac{P_w - A_w}{2g_2} \quad \text{[Equation 3]}$$

Since the below equations 4 to 6 may be derived using the equations 1 to 3, the location of the light-blocking pattern 510 between the light-emitting device 130 and the pixel lens 210 of each pixel area PA may be determined by the horizontal width of the opening 510h. For example, in the display apparatus according to the embodiment of the present disclosure, the horizontal width of the opening 510h in each pixel area PA may be proportional (positively proportional) to a vertical distance between the light-emitting layer 132 and the light-blocking pattern 510 in the corresponding pixel area PA. And, in the display apparatus according to the embodiment of the present disclosure, the horizontal width of the opening 510h in each pixel area PA may be inversely proportional to a vertical distance between the light-blocking pattern 510 (particularly, a lower surface of the light-blocking pattern 510) and the pixel lens 210 in the corresponding pixel area PA.

$$\frac{P_w - A_w}{2g_2} = \frac{B_w}{(g_1 + g_2)} \quad \text{[Equation 4]}$$

$$\frac{g_1 + g_2}{g_2} = \frac{2B_w}{P_w - A_w} \quad \text{[Equation 5]}$$

$$\frac{g_1}{g_2} = \frac{2B_w}{P_w - A_w} - 1 \quad \text{[Equation 6]}$$

Accordingly, the display apparatus according to the embodiment of the present disclosure may include the light-emitting device 130, the light-blocking pattern 510 and the pixel lens 210, which are sequentially stacked on each pixel area PA of the device substrate 110, wherein the light-blocking pattern 510 may include the opening 510h between the light-emitting device 130 and the pixel lens 210, and wherein the opening 510h may have the horizontal width according to the vertical distance between the light-emitting layer 132 of the light-emitting device 130 and the light-blocking pattern 510 and/or the vertical distance between the lower surface of the light-blocking pattern 510 and the pixel lens 210. Thus, in the display apparatus according to the embodiment of the present disclosure, the central luminance of each pixel area PA may be improved. Therefore, in the display apparatus according to the embodiment of the present disclosure, the image quality provided to the user may be increased.

A side of the light-blocking pattern 510 toward the opening 510h in each pixel area PA may have an inclination angle θ same as the light L travelling from an end of the corresponding emission region EA to an end of the corresponding pixel lens 210. Thus, in the display apparatus according to the embodiment of the present disclosure, the light travelling from each pixel area PA to the pixel lens 210 on adjacent pixel area PA may be effectively blocked by the light-blocking pattern 510.

Figure 4:
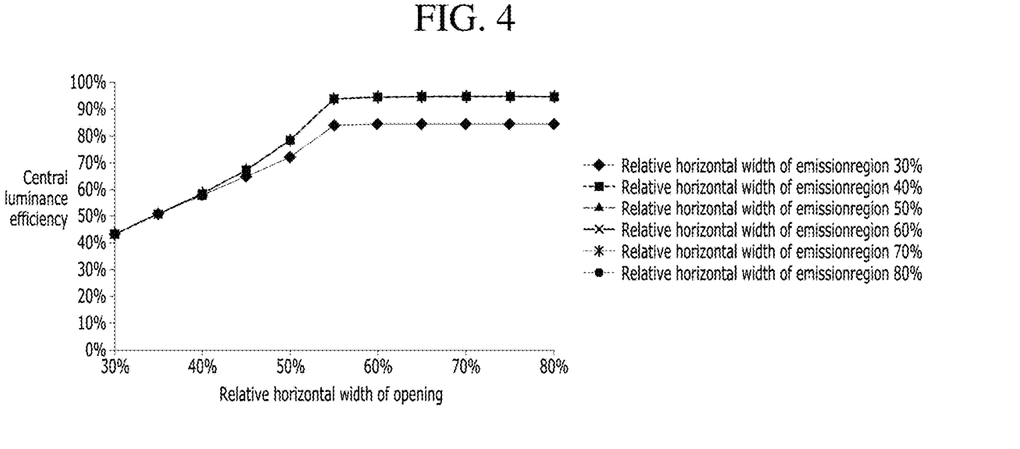
FIG. 4 is a graph showing the relationship between the relative horizontal width of the opening and the central luminance efficiency of the pixel area according to the relative horizontal width of the emission region in the display apparatus according to the embodiment of the present disclosure.

FIG. 4 is a graph showing the relationship between the relative horizontal width of the opening 510h and the central luminance efficiency of the pixel area PA according to the relative horizontal width of the emission region EA in the display apparatus according to the embodiment of the present disclosure. Herein, the relative horizontal width of the emission region EA and the relative horizontal width of the opening 510h may be derived with respect to the horizontal width of the corresponding pixel area PA.

Referring to FIG. 4, when the horizontal width of the opening 510h in each pixel area PA is at least 55% of the horizontal width of the corresponding pixel area PA, it can be seen that the central luminance efficiency of the pixel area PA is maximized regardless of the relative horizontal width of the emission region EA in the corresponding pixel area PA. Thus, the display apparatus according to the embodiment of the present disclosure may maximize the central luminance of each pixel area PA by forming the opening 510h of each pixel area PA to have a horizontal width of 55% or more with respect to the corresponding pixel area PA. And, referring to FIG. 4, when the horizontal width of each emission region EA is at least 40% of the horizontal width of the corresponding pixel area PA, the central luminance efficiency of the pixel area PA may be the same, substantially. Therefore, the display apparatus according to the embodiment of the present disclosure may prevent the luminance deviation of the pixel areas PA by forming the emission region EA of each pixel area PA to have a horizontal width of 40% or more with respect to the corresponding pixel area PA.

Figure 5:
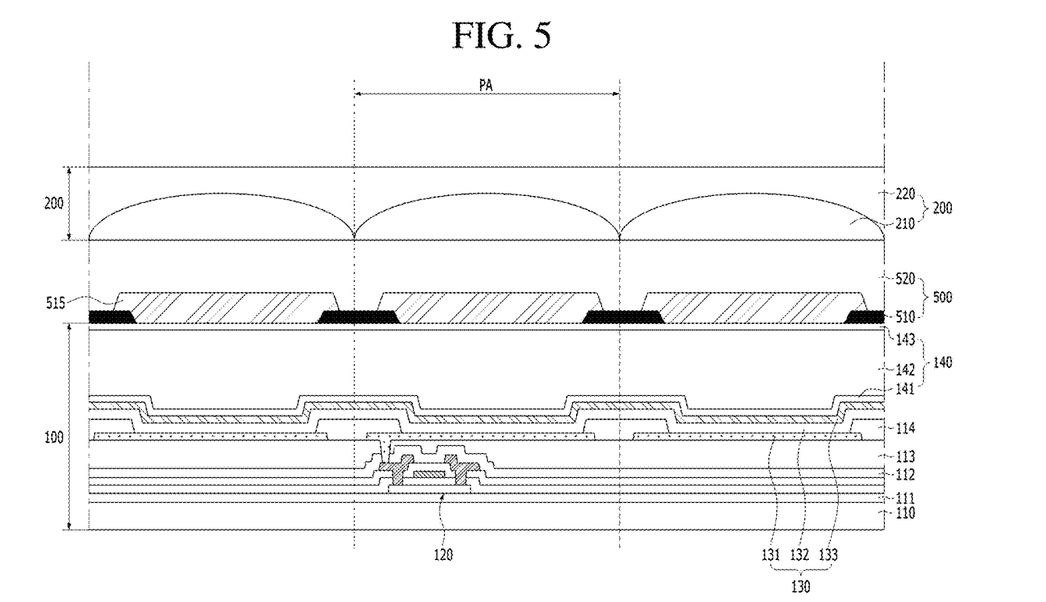
FIGS. 5 to 9 are views showing a three-dimensional (3D) display apparatus according to another embodiment of the present disclosure.

The display apparatus according to the embodiment of the present disclosure is described that the light emitted from each light-emitting device 130 may be provided to the user through the encapsulating structure 140, the pattern cover layer 520, the pixel lens 210 and the lens cover layer 220. However, the display apparatus according to another embodiment of the present disclosure may include a color filter on a path of the light emitted from each light-emitting device 130. For example, the display apparatus according to another embodiment of the present disclosure may include the color filters 515 filling the openings 510h of the light-blocking pattern 510, as shown in FIG. 5. Each of the color filters 515 may change a color displayed by the light emitted from the corresponding pixel area PA. The light-emitting layer 132 on each pixel area PA may emit the light displaying the same color as the light emitted from the light-emitting layer 132 on adjacent pixel area PA. For example, the light-emitting layer 132 on each pixel area PA may include the same material as the light-emitting layer 132 on adjacent pixel area PA. The light-emitting layer 132 on each pixel area PA may be in contact with the light-emitting layer 132 on adjacent pixel area PA. A horizontal width of each color filter 515 may be larger than the horizontal width of the opening 510h on the corresponding pixel area PA. For example, both ends of each color filter 515 may be disposed on the light-blocking pattern 510. Thus, in the display apparatus according to another embodiment of the present disclosure, the forming process of the display panel 100 including relative many steps may be simplified. Therefore, in the display apparatus according to another embodiment of the present disclosure, the process efficiency may be improved.

Figure 6:
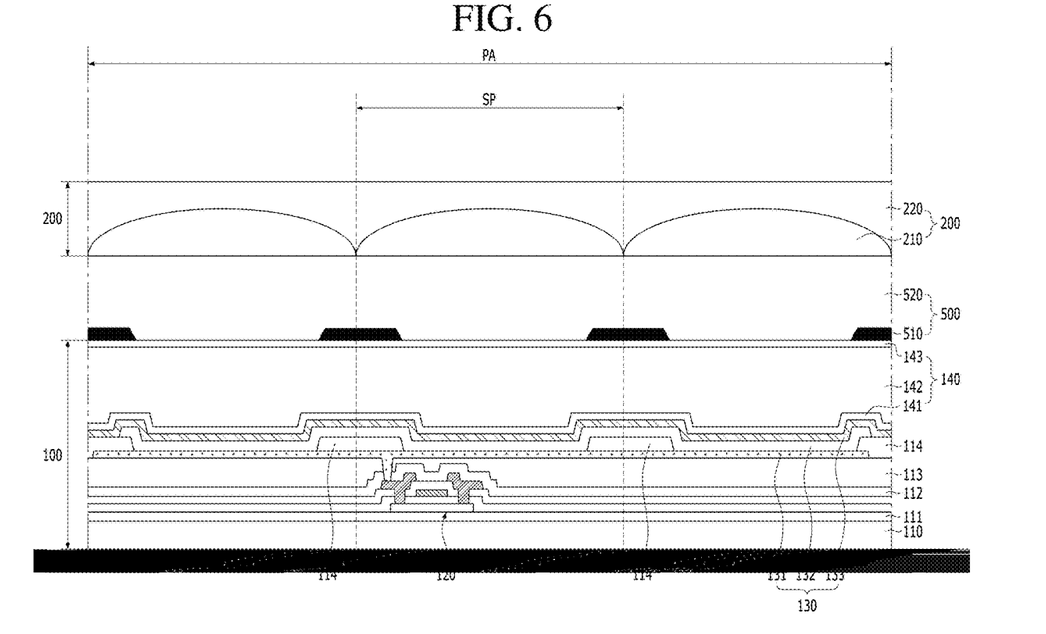

The display apparatus according to the embodiment of the present disclosure is described that the bank insulating layer 114 may define only one emission region EA in each pixel area PA. However, in the display apparatus according to another embodiment of the present disclosure, the bank insulating layer 114 may define a plurality of the emission region EA in each pixel area PA. For example, in the display apparatus according to another embodiment of the present disclosure, each of the pixel area PA may include three sub-pixel areas SP, as shown in FIG. 6. A single light-emitting device 130 may be disposed in each pixel area PA. For example, the lower electrode 131, the light-emitting layer 132 and the upper electrode 133 of the light-emitting device 130 in each pixel area PA may include a portion overlapping with the emission regions of each sub-pixel area SP, respectively. The emission region of each sub-pixel area SP may be separated from the emission region of adjacent sub-pixel area SP in each pixel area PA. For example, the bank insulating layer 114 between adjacent sub-pixel areas SP may be disposed between the lower substrate 131 and the light-emitting layer 132 of the light-emitting device 130. The light-blocking pattern 510 may be disposed on the bank insulating layer 114 between adjacent sub-pixel areas SP. The light-blocking pattern 510 may include openings on the emission region of each sub-pixel area SP. The horizontal width of the opening on the emission region of each sub-pixel area SP may have at least 55% of the horizontal width of the corresponding sub-pixel area SP. The horizontal width of the emission region in each sub-pixel area SP may have at least 40% of the horizontal width of the corresponding sub-pixel area SP. Thus, in the display apparatus according to another embodiment of the present disclosure, each pixel area PA of the display panel 100 may be divided into various shapes. Therefore, in the display apparatus according to another embodiment of the present disclosure, the degree of freedom with respect to the structure of the display panel 100 may be improved.

In the display apparatus according to another embodiment of the present disclosure, the horizontal width of each sub-pixel area SP may be the same as the horizontal width of adjacent sub-pixel area SP. For example, in the display apparatus according to another embodiment of the present disclosure, the openings of the light-blocking pattern 510 in each pixel area PA of the display panel may have the same horizontal width. However, the embodiment of the present disclosure is not limited thereto. For example, in the display apparatus according to another embodiment of the present disclosure, the sub-pixel areas SP and the openings of the light-blocking pattern 510 in each pixel area PA may have a different horizontal width from each other. The emission region of each sub-pixel area SP may have the horizontal width of 40% or more with respect to the corresponding sub-pixel area SP. Referring to FIG. 4, when the horizontal width of the emission region is at least 40% of the horizontal width of the corresponding pixel area PA, it can be seen that the central luminance efficiency of the pixel area PA is not significantly different. That is, in the display apparatus according to another embodiment of the present disclosure, the central luminance efficiency of each sub-pixel area SP may be not significantly different. Therefore, in the display apparatus according to another embodiment of the present disclosure, the degree of freedom with respect to configuration of each sub-pixel area SP may be improved.

Figure 7:
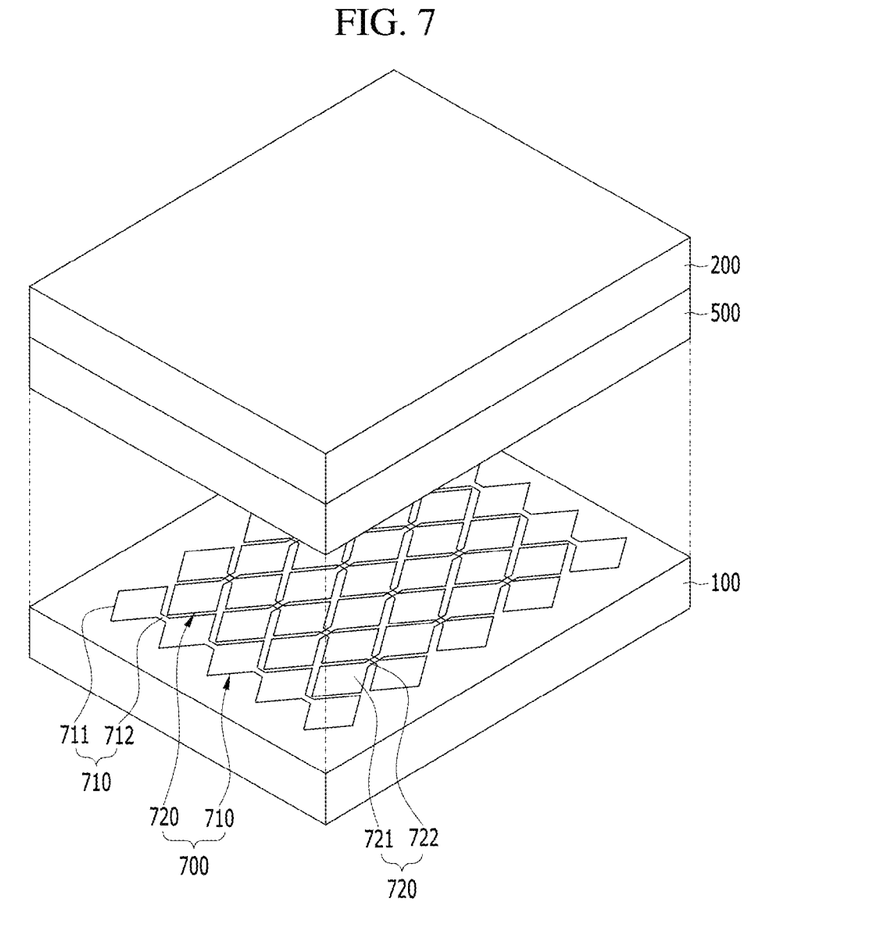
Figure 8:
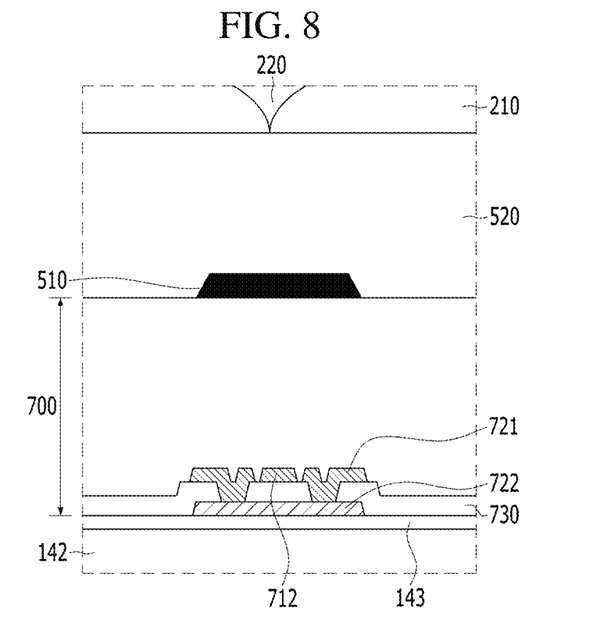

The display apparatus according to the embodiment of the present disclosure is described that the light-blocking pattern 510 may be in direct contact with the encapsulating structure 140 of the display panel 100. However, in the display apparatus according to another embodiment of the present disclosure, layers performing a specific function may be stacked between the display panel 100 and the viewing angel control element 500. For example, the display apparatus according to another embodiment of the present disclosure may include a touch structure 700 between the display panel 100 and the viewing angel control element 500, as shown in FIGS. 7 and 8. The touch structure 700 may include a first touch assembly 710 and a second touch assembly 720.

The first touch assembly 710 may include first touch electrodes 711 disposed side by side in a first direction, and first bridge electrodes 712 connecting the first touch electrodes 711 in the first direction. The second touch assembly 720 may include second touch electrodes 721 disposed side by side in a second direction perpendicular to the first direction, and second bridge electrodes 722 connecting the second touch electrodes 721 in the second direction. The second touch electrodes 721 may be disposed on the same layer as the first touch electrodes 711. Each of the second bridge electrodes 722 may cross one of the first bridge electrodes 712. For example, the touch structure 700 may include a touch insulating layer 730 covering the second bridge electrodes 722, and the first touch electrodes 711, the second touch electrodes 721 and the first bridge electrodes 712 may be disposed on the touch insulating layer 730. The second bridge electrodes 722 may include a material different from the first touch electrodes 711, the second touch electrodes 721 and the first bridge electrodes 712. The touch insulating layer 730 may include touch contact holes partially exposing each second bridge electrode 722. Each of the second touch electrodes 721 may be electrically connected to the corresponding second bridge electrode 722 by one of the touch contact holes.

The first touch electrodes 711, the first bridge electrodes 712, the second touch electrodes 721 and the second bridge electrodes 722 may include a conductive material. For example, the first touch electrodes 711, the first bridge electrodes 712, the second touch electrodes 721 and the second bridge electrodes 722 may include a metal, such as aluminum (Al), chrome (Cr), molybdenum (Mo), Titanium (Ti), copper (Cu), and tungsten (W). The first touch electrodes 711, the first bridge electrodes 712, the second touch electrodes 721 and the second bridge electrodes 722 may be spaced away from each pixel area of the display panel, or spaced away from the opening of the light-blocking pattern 510. For example, the first touch electrodes 711, the first bridge electrodes 712, the second touch electrodes 721 and the second bridge electrodes 722 may overlap the light-blocking pattern 510. The first touch electrodes 711, the first bridge electrodes 712, the second touch electrodes 721 and the second bridge electrodes 722 may be disposed between the bank insulating layer and the light-blocking pattern 510. Thus, in the display apparatus according to another embodiment of the present disclosure, decreasing the luminance due to the touch structure 700 may be prevented. And, in the display apparatus according to another embodiment of the present disclosure, the reflection of external light due to the touch structure 700 may be prevented or at least reduced by the light-blocking pattern 510. That is, in the display apparatus according to another embodiment of the present disclosure, the touch structure 700 may be not recognized by the user due to the light-blocking pattern 510. For example, in the display apparatus according to another embodiment of the present disclosure, the light-blocking pattern 510 may be function as a black matrix. Therefore, in the display apparatus according to another embodiment of the present disclosure, the quality of the image recognized by the user may be improved.

Figure 9:
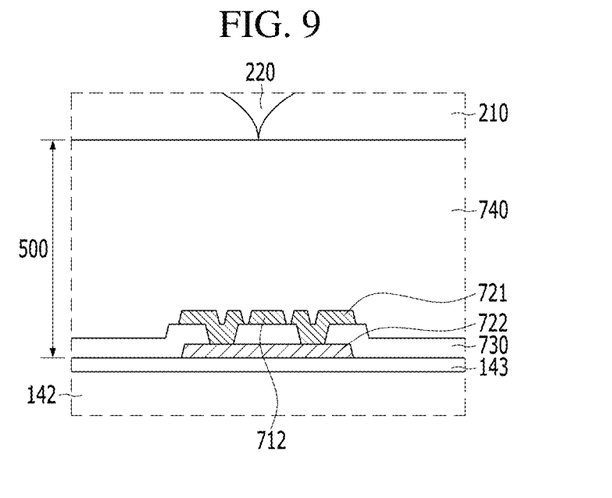

The touch structure 700 may include a touch cover layer 740 (as shown in FIG. 9) on the first touch electrodes 711, the first bridge electrodes 712, the second touch electrodes 721 and the second bridge electrodes 722. The touch cover layer 740 may prevent the damage of the touch structure 700 due to the external impact. A thickness difference due to the first touch electrodes 711, the first bridge electrodes 712, the second touch electrodes 721 and the second bridge electrodes 722 may be removed by the touch cover layer 740. For example, an upper surface of the touch cover layer 740 toward the viewing angle control element 500 may be a flat surface. The light-blocking pattern 510 and the pattern cover layer 520 may be in direct contact with the touch cover layer 740. Thus, in the display apparatus according to another embodiment of the present disclosure, the degree of freedom with respect to composition of the display panel 100 may be improved.

The display apparatus according to the embodiment of the present disclosure is described that the light-blocking pattern 510 may include an insulating material. However, in the display apparatus according to another embodiment of the present disclosure, the light-blocking pattern 510 may include a metal. For example, in the display apparatus according to another embodiment of the present disclosure, the viewing angle control element 500 may include touch electrodes 721 and bridge electrodes 712 and 722, as shown in FIG. 9. A portion of each touch electrode 721 may block the light travelling from each pixel area to the pixel lens 210 on adjacent pixel area. For example, a portion of the touch electrodes 721 may be function as the light-blocking pattern. That is, the display apparatus according to another embodiment of the present disclosure may include the light-blocking pattern formed of the same material as the touch electrodes 721. Thus, in the display apparatus according to another embodiment of the present disclosure, a process of forming the light-blocking pattern may be simplified. Therefore, in the display apparatus according to another embodiment of the present disclosure, the process efficiency may be improved.

In the result, the display apparatus according to the embodiments of the present disclosure may include the light-emitting device, the light-blocking pattern and the pixel lens, which are sequentially stacked on the pixel area of the device substrate, wherein the light-blocking pattern may include an opening between the light-emitting device and the pixel lens, and wherein the horizontal width of the opening may be determined by the location of the light-blocking pattern between the light-emitting device and the pixel lens. Thus, in the display apparatus according to the embodiments of the present disclosure, the travelling direction of the light emitted from each pixel area may be restricted by the light-blocking pattern, and the central luminance of each pixel area may be increased by the pixel lens. Thereby, in the display apparatus according to the embodiments of the present disclosure, the quality of the image may be improved.

What is claimed is:

1. A display apparatus comprising:
   a device substrate including a first pixel area;
   a bank insulating layer on the device substrate, the bank insulating layer defining a first emission region in the first pixel area;
   a light-emitting device including a lower electrode, a light-emitting layer, and an upper electrode, which are sequentially stacked on the first emission region of the device substrate;
   a light-blocking pattern on the bank insulating layer, the light-blocking pattern including a first opening disposed on the light-emitting device; and
   a first pixel lens on the first opening of the light-blocking pattern, the first pixel lens having a horizontal width that is larger than the first emission region,
   wherein a location of the light-blocking pattern and a horizontal width of the first opening satisfy the below equation, where $g_1$ is a vertical distance between the light-emitting layer and the light-blocking pattern, $g_2$ is a vertical distance between a lower surface of the light-blocking pattern and the first pixel lens, $P_W$ is a horizontal width of the first pixel area, $A_W$ is a horizontal width of the first opening, and $B_W$ is a half of a horizontal width of the bank insulating layer in the first pixel area.

$$\frac{g_1}{g_2} = \frac{2B_w}{P_w - A_w} - 1 \qquad \text{[Equation]}$$

2. The display apparatus according to claim 1, wherein the first pixel lens has a horizontal width that is the same as the first pixel area.

3. The display apparatus according to claim 1, wherein the bank insulating layer and the light-emitting device in the first pixel area have a symmetrical shape with respect to a center of the first pixel area.

4. The display apparatus according to claim 1, wherein the horizontal width of the first opening is at least 55% of a horizontal width of the first pixel area.

5. The display apparatus according to claim 1, wherein a horizontal width of the first emission region is at least 40% of a horizontal width of the first pixel area.

6. The display apparatus according to claim 1, further comprising a second pixel lens on a second pixel area of the device substrate which is disposed adjacent to the first pixel area,
- wherein the light-blocking pattern includes a second opening between a second emission region defined by the bank insulating layer in the second pixel area and the second pixel lens,
- wherein the lower electrode, the light-emitting layer, and the upper electrode of the light-emitting device extend between the second emission region of the device substrate and the second opening, and
- wherein the bank insulating layer between the first emission region and the second emission region is disposed between the lower electrode and the light-emitting layer.

7. The display apparatus according to claim 6, wherein a horizontal width of the second opening is a same as the horizontal width of the first opening.

8. The display apparatus according to claim 1, wherein the light-blocking pattern includes a metal.

9. A display apparatus comprising:
- a device substrate including a pixel area;
- a bank insulating layer on the device substrate, the bank insulating layer defining an emission region in the pixel area;
- a light-emitting device including a lower electrode, a light-emitting layer, and an upper electrode, which are sequentially stacked on the emission region of the device substrate;
- a first light-blocking pattern on the bank insulating layer, the first light-blocking pattern including an opening disposed on the light-emitting device;
- a pixel lens on the opening of the first light-blocking pattern, the pixel lens having a horizontal width that is larger than the emission region;
- an encapsulating structure covering the bank insulating layer and the light-emitting device; and
- a touch structure between the encapsulating structure and the pixel lens,
- wherein a horizontal width of the opening is proportional to a vertical distance between the light-emitting layer and the first light-blocking pattern, and
- wherein the first light-blocking pattern includes a same material as a touch electrode of the touch structure.

10. The display apparatus according to claim 9, wherein the touch electrode includes a first touch electrode connected by a first bridge electrode in a first direction and a second touch electrode connected by a second bridge electrode in a second direction perpendicular to the first direction, and
- wherein the second touch electrode includes a same material as the first touch electrode.

11. The display apparatus according to claim 10, wherein at least one of the first bridge electrode and the second bridge electrode includes a same material as the first touch electrode and the second touch electrode.

12. The display apparatus according to claim 10, wherein the second bridge electrode is disposed on a different layer from the first bridge electrode.

13. The display apparatus according to claim 12, further comprising:
- a touch insulating layer covering the second bridge electrode,
- wherein the first touch electrode, the first bridge electrode and the second touch electrode are disposed on the touch insulating layer.

14. The display apparatus according to claim 10, wherein the touch electrode is disposed outside the emission region.

15. The display apparatus according to claim 14, wherein the touch electrode includes a metal.

16. The display apparatus according to claim 10, further comprising:
- a second light-blocking pattern overlapping with the first light-blocking pattern,
- wherein the second light-blocking pattern includes a different material from the first light-blocking pattern.

17. The display apparatus according to claim 16, further comprising:
- a touch cover layer on the touch electrode of the touch structure,
- wherein the second light-blocking pattern is disposed on the touch cover layer.

18. A display apparatus comprising:
- a lower electrode on a device substrate;
- a bank insulating layer on the device substrate, the bank insulating layer covering an end and another end of the lower electrode;
- a light-emitting layer on a portion of the lower electrode exposed by the bank insulating layer;
- an upper electrode on the light-emitting layer;
- a pixel lens on the bank insulating layer and the upper electrode;
- a light-blocking pattern between the bank insulating layer and the pixel lens; and
- a touch electrode between the bank insulating layer and the light-blocking pattern,
- wherein the light-blocking pattern includes an opening between the upper electrode and the pixel lens, the touch electrode spaced apart from the opening, and
- wherein a horizontal width of the opening is inversely proportion to a vertical distance between the light-blocking pattern and the pixel lens.

19. The display apparatus according to claim 18, further comprising a color filter filling the opening between the upper electrode and the pixel lens.

20. The display apparatus according to claim 18, wherein the light-blocking pattern includes an insulating material.

* * * * *